(12) United States Patent
Bryborn et al.

(10) Patent No.: US 7,321,692 B2
(45) Date of Patent: Jan. 22, 2008

(54) METHOD, DEVICE AND COMPUTER PROGRAM PRODUCT FOR PROCESSING INFORMATION IN A MEMORY

(75) Inventors: Mattias Bryborn, Lund (SE); Erik Sparre, Lomma (SE)

(73) Assignee: Anoto AB, Lund (SE)

( * ) Notice: Subject to any disclaimer, the term of this patent is extended or adjusted under 35 U.S.C. 154(b) by 895 days.

(21) Appl. No.: 10/292,711

(22) Filed: Nov. 13, 2002

(65) Prior Publication Data

US 2003/0159010 A1 Aug. 21, 2003

Related U.S. Application Data

(60) Provisional application No. 60/333,166, filed on Nov. 27, 2001.

(30) Foreign Application Priority Data

Nov. 13, 2001 (SE) .................................. 0103770

(51) Int. Cl.
*G06K 9/46* (2006.01)
(52) U.S. Cl. ..................................... 382/202; 382/313
(58) Field of Classification Search ................ 382/202, 382/305, 312, 313, 314; 358/473; 345/179; 178/18.1; 715/530
See application file for complete search history.

(56) References Cited

U.S. PATENT DOCUMENTS

| 5,652,412 A | 7/1997 | Lazzouni et al. | 178/18.1 |
| 5,852,434 A | 12/1998 | Sekendur | 345/179 |
| 6,055,552 A | 4/2000 | Curry | 715/530 |
| 2002/0090149 A1* | 7/2002 | Ericson et al. | 382/305 |

FOREIGN PATENT DOCUMENTS

| GB | 2206669 A | 5/1997 |
| WO | WO 99/50787 A1 | 10/1999 |
| WO | WO 00/73983 A1 | 12/2000 |
| WO | WO 01/02946 A1 | 1/2001 |
| WO | WO 01/26033 A1 | 4/2001 |
| WO | WO 01/48685 A1 | 7/2001 |
| WO | WO 01/61635 A2 | 8/2001 |
| WO | WO 01/71653 A1 | 9/2001 |
| WO | WO 01/74598 A1 | 10/2001 |
| WO | WO 01/75781 A1 | 10/2001 |

OTHER PUBLICATIONS

Jeffrey H. Kingston, "Algorithms and Data Structures", Addison-Wesley Publishing Company, Chapters 6 and 7, pubished 1990.

* cited by examiner

*Primary Examiner*—Duy M. Dang
(74) *Attorney, Agent, or Firm*—Birch, Stewart, Kolasch & Birch, LLP

(57) ABSTRACT

A method, computer readable medium and device are provided for freeing memory in a device with limited memory, in which a plurality of pen strokes have been recorded, in electronic form in the memory in association with a page address of one of a plurality of logical pages and a recording time. The method, computer readable medium and device provide for identifying page address for the plurality of pen strokes recorded in the device; identifying the recording time of the most recently recorded pen stroke associated with each of the identified page addresses; selecting the page address among the identified page addresses which has the oldest most recently recorded pen stroke; and deleting all the pen strokes associated with the selected page address.

19 Claims, 7 Drawing Sheets

METHOD, DEVICE AND COMPUTER PROGRAM PRODUCT FOR PROCESSING INFORMATION IN A MEMORY

This application claims priority on provisional Application No. 60/333,166 filed on Nov. 27, 2001, the entire contents of which are hereby incorporated by reference.

TECHNICAL FIELD

The present invention relates to a method, a device and a computer program product for freeing memory space in a device with limited memory space, in which device a plurality of pen strokes has been recorded and stored in electronic form.

BACKGROUND TO THE INVENTION

A user device, for example of the type described in WO 01/26033, which is incorporated herein by reference, can essentially be constructed as a pen. This pen-like device can have a built-in camera for reading a position-coding pattern, and data processing means for interpreting, storing and transmitting information from the position-coding pattern. In addition, it can have a working memory (RAM) for temporary storage of data that has been recorded by the device, and a storage memory for permanent or less temporary storage of data. Such a storage memory can consist of, for example, one or more flash memories or other non-volatile memories of a suitable storage capacity and type. Permanent storage of data can be achieved by the content of the user device's storage memory being transferred to or synchronized with, for example, a server, a personal computer or a personal digital assistant ("PDA"). Such synchronization can be carried out via one or more communication media, such as short-range radio (for example Bluetooth®), IrDA, cable, the Internet, mobile telephone communication, or other technologies that make the electronic transmission of information possible.

The above-mentioned position-coding pattern can be arranged on a base, for example a sheet of paper, in the form of, for example, printed machine-readable marks. When the user device is passed over such a position-coded base, the device may record and decode the position-coding pattern and calculate pairs of coordinates which form an electronic representation of the movement of the user device on the base.

The device may be arranged to record the position-coding pattern whenever a sensor in the user device indicates that the device has been lowered onto the base. The recording may be terminated by the sensor indicating that the user device has been raised from the base. The series of coordinates that has been generated between the user device being lowered and being raised is hereinafter called a "pen stroke".

The thus-recorded pen strokes can be stored in the user device and, if necessary or desired, can be processed by, for example, handwriting recognition software to convert handwritten information into machine-readable information.

Position-coding patterns of the above kind are known from aforesaid WO 01/26033, as well as from, i.e., U.S. Pat. No. 5,652,412, U.S. Pat. No. 5,852,434, WO 99/50787, and WO 00/73983.

Some position-coding patterns may be capable of coding coordinates for a very large number of positions. Such a position-coding pattern can advantageously be divided into subareas, for example for particular applications, but it can also be divided into subareas that each are intended to be applied on a physical page in, for example, a notepad. The user device may be arranged to logically associate all positions coded by such a subarea with a specific digital page or page instance, so that the user device can process data that is recorded from, for example, a physical page in a notepad as belonging together.

Such a logical association of positions with digital pages is further disclosed in WO 01/48685, which is incorporated herein by reference.

The position-coding pattern may alternatively be capable of coding only enough positions to be applied on a single physical page. In this case, the user device may be arranged to record additional information to associate the recorded positions with a digital page. For example, the additional information may include a page identifier which may be incorporated in the coding pattern, such as disclosed in aforesaid WO 99/50787, or be inferred by the user device from a bar code, a combination of characters or the like on the physical page.

Thus, each pen stroke can be stored in electronic form in the user device's storage memory together with, for example, information about on which part of the position-coding pattern and/or at what time the pen stroke was recorded. For example, the starting time of each pen stroke can be recorded.

In order to produce an adequate representation of handwritten information, the user unit should read off the position-coding pattern at a rate of about 50-100 Hz. Thus, it is recognized that the number of pairs of coordinates that are recorded by the user device in connection with, for example, a text being written down can become very large, even if the recorded pen strokes were to be stored after compression.

Since the built-in storage memory capacity of the user device normally is limited, for example by cost considerations or by limitations in the available space in the user device, there is a risk that the user device's storage memory can become full.

Similar problems may occur in other user devices for electronic recording of handwritten information. For example, in GB-A-2 306 669, a pen-like device records its movement by means of built-in acceleration sensors and associates the recorded movement data with a page identifier given by a bar code on the physical page. Still further, in U.S. Pat. No. 6,055,552, a digital electronic clipboard is arranged to track the movement of a writing device on a pile of physical pages mounted on the clipboard. The recorded movement data is associated with a page identifier entered by the user via a keypad on the clipboard or recorded by the writing device from a bar code on the top-most page in the pile.

In the aforesaid U.S. Pat. No. 6,055,552 when a digital page is transferred from the clipboard to an external unit, such as a personal computer, all pen strokes associated with the transferred digital page are deleted from the storage memory of the clipboard. This means that it is necessary to transfer the memory content to the personal computer at regular intervals in order that the storage memory will not become full, which in turn limits the time during which the clipboard can function independently or "off-line", i.e. without contact with the personal computer.

SUMMARY OF THE INVENTION

An object of the present invention is to alleviate the above-described shortcomings of the prior art devices for electronic recording of handwritten information.

Another object is to provide a technique for memory management which is easy to understand for a user.

It also an object to provide a technique for memory management that allows the user unit to be designed without a user interface or with a user interface that provides for only limited user interaction.

These objects are achieved wholly or partially by a method according to claim 1, a computer program product according to claim 19 and a device according to claim 20. Preferred embodiments are defined in the dependent claims and in the description below.

Thus, a method is provided for freeing memory in a device with limited memory, into which device a plurality of pen strokes is entered. Each of the pen strokes is stored in electronic form in the memory in association with one of a plurality of logical pages and a recording time. When space in the memory is to be freed, all the pen strokes associated with a specific logical page are deleted. The specific page is determined on the basis of a time at which a pen stroke associated with the logical page was recorded by the device.

By freeing memory logical page by logical page instead of deleting individual pen strokes, better organized memory management is achieved since only complete logical pages are deleted from the memory. Thus, there is no risk that the memory contains only part of the pen strokes that have been recorded in association with a given logical page; either all pen stokes or none are retained for a given logical page. Thus, the memory is freed in well-defined units that are intuitive for the user. In addition, good conformity may be achieved between the information on a physical page, for example a sheet of paper, and information in electronic form associated with a logical page. In addition, repeated transmission of the same memory content is made possible, for example to different servers, computers or PDAs. Further, by selecting the logical pages that are to be deleted on the basis of the time of the recording of an associated pen stroke, the user's involvement in the memory freeing process can be wholly or partially eliminated.

According to the method, the specific logical page may be determined on the basis of its most recently recorded pen stroke having been recorded earlier than the most recently recorded pen stroke of any of the other logical pages.

This is a way of selecting the logical pages whose pen strokes are to be deleted, in such a way that the logical pages that were used most recently are retained, while older logical pages' pen strokes are deleted and thereby make room for new pen strokes. By the determination of which logical pages are to be deleted being carried out in this way, a rule is created that is easy for the user to understand: logical pages that have not been used for a long time are deleted from the memory.

Alternatively, the specific logical page may be determined by a pen stroke associated with the specific logical page having been recorded prior to a predetermined time. The predetermined time can be a particular date. In this case, all logical pages with an earliest or latest recoding time that falls before this particular date may be deleted automatically. Alternatively, the predetermined time can be relative to the time when the logical page was used for the first or the last time. For example, a discount coupon may be automatically deleted two weeks after it was first or last used. Alternatively, the predetermined time can be relative to the current time. For example, logical pages that contain an earliest or latest pen stoke that is more than two weeks old may be deleted automatically. At least some of the alternatives above may be suitable for managing logical pages relating to time-limited offers.

Alternatively or additionally, the specific page may be determined by a logical page proposed by the device being confirmed by the user. Although this method requires a certain degree of involvement on the part of the user, it can be preferable in certain situations, in particular if there are logical pages that the user can be expected to want to retain, irrespective of their age or use.

The invention can be implemented as a computer program which is stored in the memory of the device and executed by a processor of the device. Such a computer program may be embodied in a computer program product. Alternatively, the method can be implemented completely or partially in the form of an application-specific circuit, such as an ASIC, or in the form of digital or analogue circuits or of some suitable combination thereof.

In addition, there is provided a device for electronic recording of pen strokes, each of which is associated with a logical page. Such a device comprises a data processing unit that has a memory with limited space for storing the pen strokes in electronic form. The data processing unit is arranged to free space in the memory by deleting from the memory all the pen strokes associated with a specific logical page. The data processing unit is also arranged to determine the specific logical page on the basis of a time at which a pen stroke associated with the logical page was recorded by the device.

BRIEF DESCRIPTION OF THE DRAWINGS

The invention will be described in more detail below, with reference to the accompanying schematic drawings which, for the purpose of exemplification, show currently preferred embodiments of the invention, according to its different aspects.

DESCRIPTION OF PREFERRED EMBODIMENTS

Figure 1:
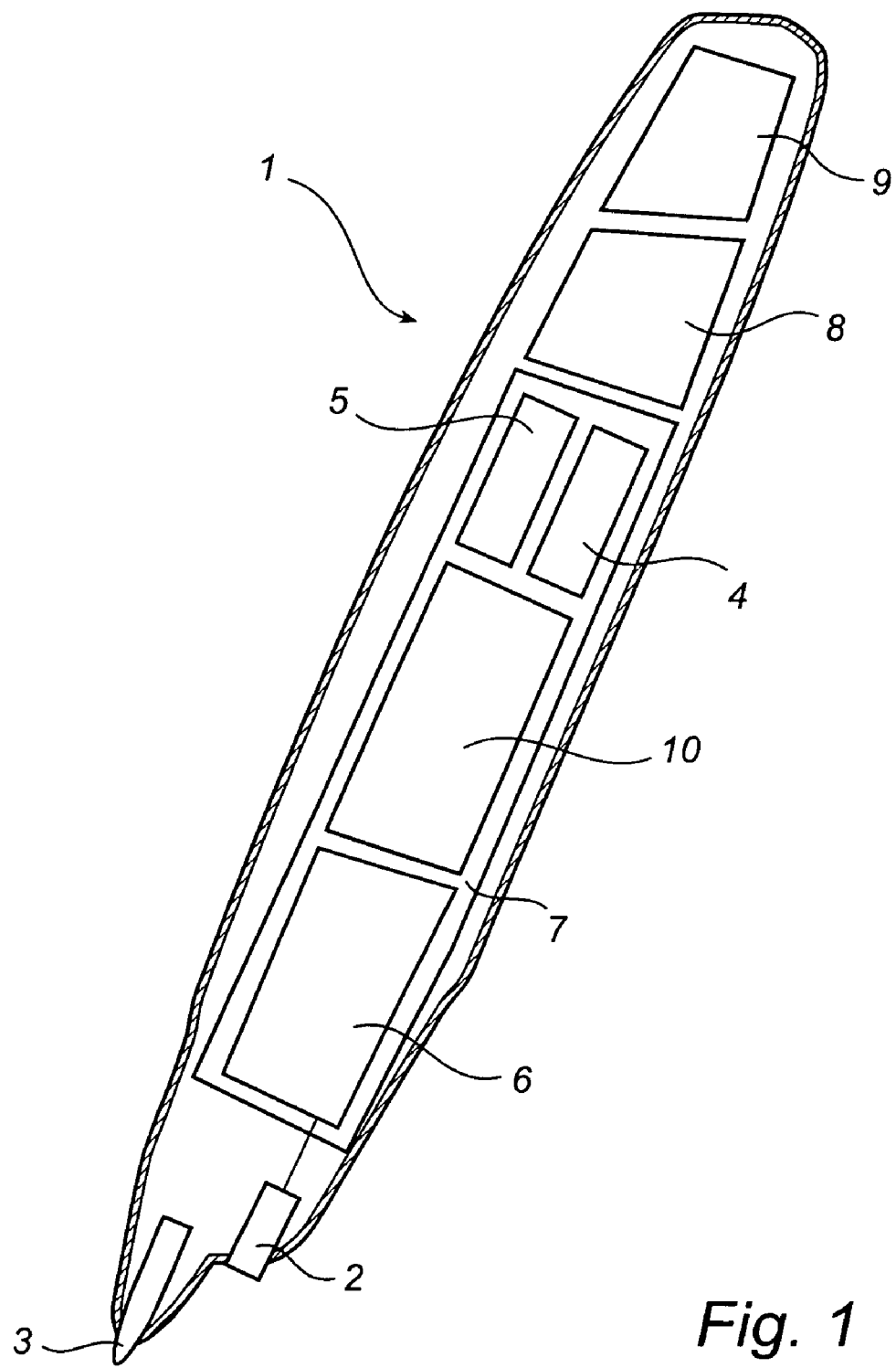
FIG. 1 shows schematically a prior-art user device, in which the present invention can be implemented.

FIG. 1 shows a prior-art user device 1, which is described in more detail in aforesaid WO 01/26033 and WO 00/73983. The device 1 has a camera 2 which is arranged to capture in real time a digital representation of a position-coding pattern that is arranged on a base. On the basis of the digital representation, coordinates are calculated for the positions that are marked using a pen point 3 of the device. This pen point can be, but does not need to be, arranged to act as a marking pen point for visibly writing down characters or images on a base such as a sheet of paper. In addition, the device has a data processing unit 7 that comprises data acquisition means 6 designed to process incoming data from the camera 2, working memory 4 and storage memory 5 and a programmable data processor 10 in the form of, for example, a computer processor. In addition, the device can have a power supply unit 8 in the form of, for example, a battery and a communication unit 9 for communication with external units. Such communication units can, for example, utilize infrared technology, cable or short-range radio link, such as Bluetooth® or wireless LAN.

The position-coding pattern on the base may be a small subset of an abstract position-coding pattern. Such an abstract position-coding pattern can be embodied as in aforesaid WO 01/26033, where the pattern defines a very large, continuous, abstract space of positions. Theoretically, this specific pattern defines a space made up of $4^{36}$ unique positions. This kind of position-coding pattern can denoted a global position-coding pattern, and a small subset of this global pattern can be mapped (printed) on a physical page, for example a sheet of paper.

As disclosed in aforesaid WO 01/48685, this global pattern can be logically divided into different segments. The segments may in turn be divided into "shelves", which may be divided into "books", each including a number of pages. The location of a particular logical page in the abstract pattern can thus be referenced as: segment.shelf.book.page, for example 231.841.334.226, in approximately the same manner as an IP address. By analogy, this page reference may be called a "page address". A certain local position on this logical page can be referenced as 231.841.334.226: x=53421, y=63254.

Figure 2:
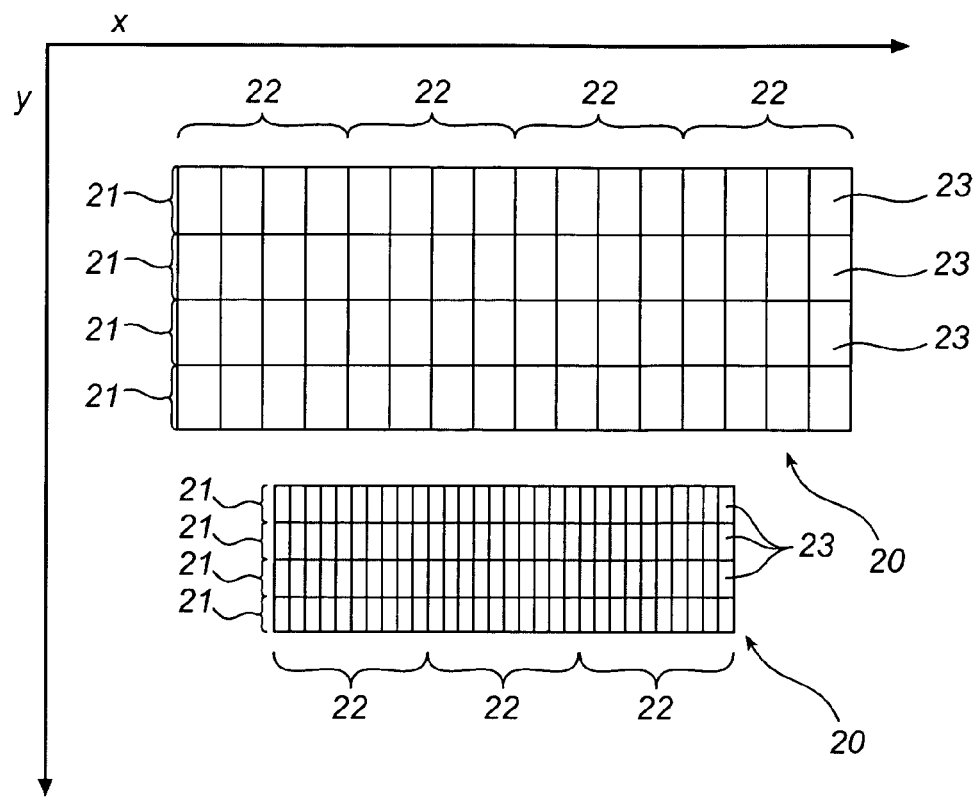
FIG. 2 shows schematically a coordinate system which is divided into logical pages.

FIG. 2 further illustrates this concept of subdividing the abstract space of positions into logical pages. As shown, different segments 20 may include shelves 21, books 22 and pages 23 of different size. Although not shown in FIG. 2, different shelves within a segment may include books and pages of different size, and different books within a shelf may include pages of different size.

It is also important to note that the size of a logical page must not equal the size of a physical page. Thus, although a logical page may be mapped in its entirety on a physical page, it is also conceivable to map only one or more parts of a logical page on a physical page. It is even conceivable to map parts from different pages, for example within a book, on a physical page.

Particulars about the subdivision of the global pattern is stored in the storage memory 5 of the user device 1. Thus, after having calculated a global position from a digital representation (e.g. an electronic image) of the position-coding pattern, the user device 1 is capable of transforming the global position to a page address and a local position. The combination of page address and local position may be stored in the storage memory 5, as will be described in more detail below.

It should also be mentioned that one and the same subset of the global pattern may result in more than one logical page in the storage memory. More specifically, the user device may be arranged to create a new logical page in its storage memory every time it detects an initialization indication. Such an initialization indication may be created by the user device recording one or more local positions that are dedicated to such an initialization, for example from an initialization field on the physical page, or by the user device recording a dedicated button being pressed or a dedicated voice command being issued, etc. Every such new logical page may be given a unique page address by extending the original page address that the device calculates from recorded global position(s). Alternatively, every logical page may be given the original page address and be distinguished by an instance flag or counter being set in the storage memory in association with the page address.

A pen stroke can be stored in the device's memory as a series of local positions, each given as a pair of coordinates, which describe the movement of the device across the base provided with the position-coding pattern. The pen stroke can contain the page address that indicates on which logical page the pen stroke has been recorded and a time that indicates when the pen stroke was recorded.

Figure 8A:
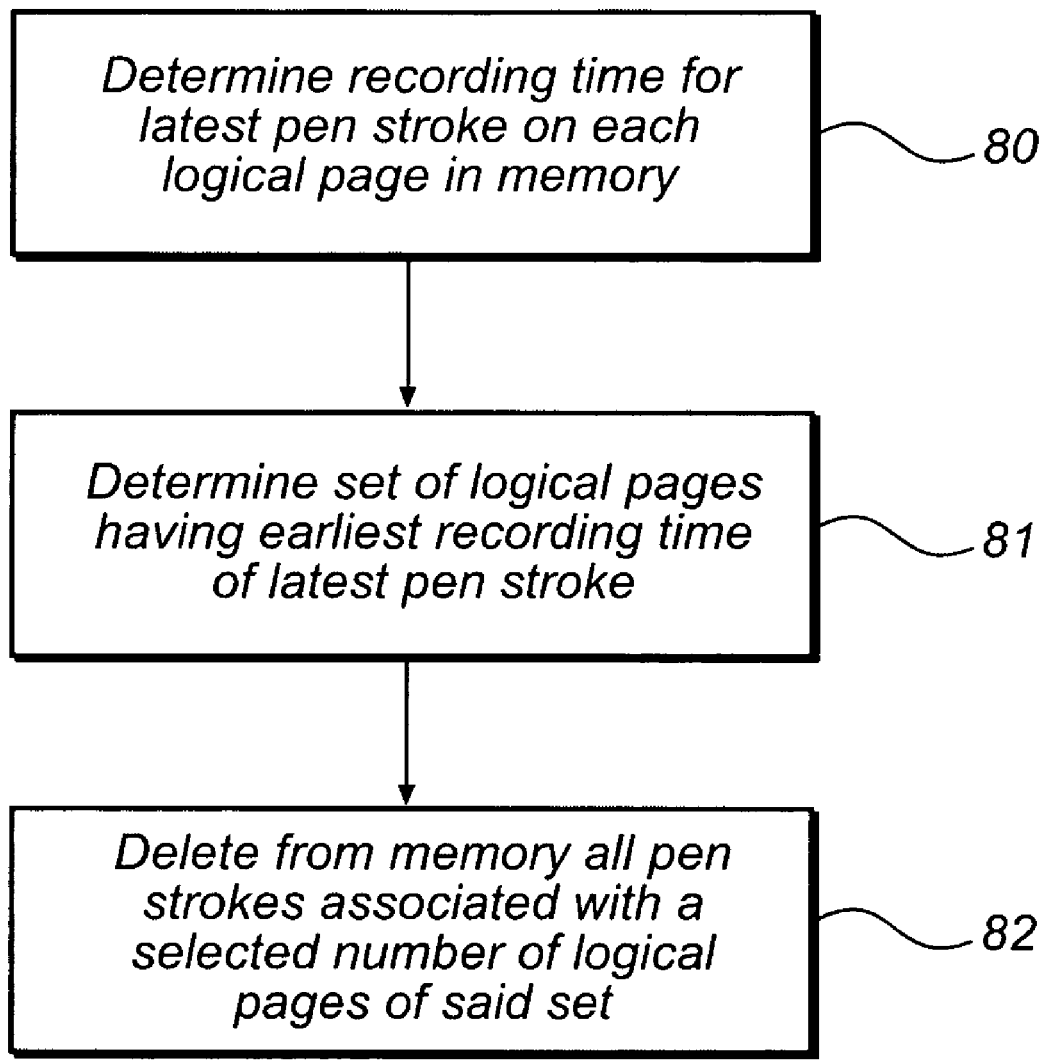
FIGS. 8A-8B show flow charts for a method for freeing memory in the device of FIG. 1.

FIG. 8A schematically shows a method for determining which logical pages (and their associated pen strokes) are to be deleted from the storage memory, so as to free memory in the user device. A first main step 80 includes determining a time for the most recently recorded (the youngest) pen stroke on each logical page. In a second main step 81, those logical pages are selected which have the oldest most recently recorded pen stroke. In a final third main step 82, all pen strokes that are associated with at least some of the selected logical pages are deleted from the storage memory.

According to one embodiment, the determination of which logical pages are to be deleted is carried out in its entirety at the time when it is necessary to free storage memory space.

In the following, the method will be described in outline and thereafter in the form of an example in which eleven pen strokes have been recorded on four different logical pages. The method according to this example can appear trivial, but it is to be borne in mind that the method is actually intended and may be suitable for the management of thousands of pages and pen strokes or more.

For the identification of the most recently entered pen stroke on the respective logical page, all the pen strokes stored in the memory can be searched, with the page address and the time of recording being extracted for each of the pen strokes. Thereafter entries are stored comprising a time for each page address in a first sortable data structure in the memory, which in the following will be called the page address table, since the search key of the data structure is the page address. The entries are stored in the page address table in such a way that a list is obtained of page addresses occurring in the memory and the most recent (youngest) time associated with each page address.

Optionally, the entries in the page address table can contain additional parameters, such as a measure of the memory space that can be freed by the pen strokes associated with the logical page being deleted. The size of the table (number of entries=A) can be selected on the basis of the estimated number of page addresses in the device's storage memory, the available storage memory and the processing speed of the device.

In a device that contains pen strokes from a very large number of logical pages, the data structure in which page addresses and times are stored can, however, become very large.

In order to keep down the size of these data structures, a second sortable data structure is initiated, below called a time table, since the search key of the data structure is the time. This second data structure also comprises entries with page addresses and times of the most recently recorded pen stroke for the respective page address. Whereas the first data structure is sorted with regard to the page address, the second data structure is sorted with regard to the time of recording. In this example, the time table is assumed to contain B entries. The size B is selected on the basis of factors such as the number of logical pages that need to be removed in normal conditions in order to free the required amount of storage space and the processing speed of the device.

According to one embodiment, both the page address table and the time table can be so-called max-heaps. The advantage of these is that they take up relatively little storage space and that operations such as adding and extracting data values are carried out very quickly, even if the heap is very large. A more detailed description of heaps is to be found in Chapters 6 and 7 of Kingston, J. H.: "Algorithms & Data Structures: Design, Correctness, Analysis", Addison-Wesley Publishing Co., 1995.

In order to determine which page addresses are to be searched, an overall search range can be selected to contain those page addresses which are to be searched in the device's storage memory and the maximal recording times of which are to be identified. At the start of the method, the overall search range can be selected as either the total number of available page addresses in accordance with the subdivision of the global pattern into logical pages, or on the basis of the total page address range that is stored in the device's storage memory. With the latter alternative, information regarding the largest and smallest page address that is stored in the device's storage memory can be used. Such information can be kept available in the device relatively easily.

The search may be commenced at the lower limit of the overall search range, searching in the memory being carried out for page addresses belonging to a first sub-range of the overall search range, and the first data structure being gradually filled up as new page addresses in the range are encountered. If the first data structure becomes full, the encountered page addresses that are already stored in the table may be updated with regard to the time. Other page addresses encountered will be compared with the data structure's largest page address and will replace this if the page address encountered is less than said largest page address. The page addresses that are larger than said largest page address will thereby be searched during a subsequent iteration. If the first data structure holds A entries, the search of the first sub-range will thus result in the A lowest page addresses that occur in the device's memory.

When all of the first search range has been searched, entries are copied to the second data structure, which is sorted with regard to the time. If the second data structure holds a smaller number of entries than the first data structure, the entries that have the oldest times will be transferred.

When the first data structure has been searched and entries therein have been transferred to the second data structure, the first data structure is cleared.

Thereafter, a second sub-range of page addresses is created, the lower page address of which will be adjacent to the upper limit of the first sub-range and the upper limit of which can coincide with the upper limit of the overall search range.

A further search is then carried out in the device's memory for the page addresses that are included in the second sub-range, whereby the first data structure will contain the A next page addresses.

After the search of the second sub-range's page addresses, the transfer of times to the second data structure is repeated, so that this will contain the entries that correspond to the logical pages that have the B oldest recording times from among the 2A smallest page addresses.

Thereafter the method is repeated with clearing of the first data structure, the creation of a new sub-range, searching for page addresses in the memory and transferring of entries to the second data structure, until all or a sufficient number of the page addresses occurring in the device's memory have been searched and the time table contains the B least maximum times, that is the B logical pages that have the oldest most recent recording times.

If a binary heap is used as the second data structure, the recording times in the heap may not necessarily all be correctly sorted relative to each other. However, the entry in the second data structure that has the maximal (that is the youngest) recording time is always obtainable.

In order to create a list of a number of logical pages that are to be deleted from the device's storage memory, it is possible to initiate a third data structure that constitutes a result table with C entries, which table is filled by extracting and discarding B-C maximum values from the time table and by extracting and storing the remaining C maximum values from the second data structure. The result table is preferably arranged in such a way that its extreme value consists of the page address with the oldest most recently recorded pen stroke. It can in addition advantageously be completely sorted, so that a prioritizing list of the logical pages that are to be removed is obtained.

The second and third data structures can be, but do not need to be, of the same size. The third data structure is arranged to contain the page addresses that have the oldest most recently recorded pen strokes.

As an alternative, a sorted list can be used for the second data structure, which list can easily be sorted and thereby indicate the logical pages that are to be deleted. Accordingly, no result table in the form of a third data structure needs to be used.

WO 01/75781, which is incorporated herein by reference, describes how different logical pages can be logically associated with each other in the storage memory of the user device. Such a logical association may be created whenever a pen stroke extends over two or more logical pages. One way of handling this in connection with the freeing of memory is to process associated logical pages as a unit, that is if a logical page with which other logical pages are associated is deleted, the associated logical pages are also deleted from the device's memory.

In order to further illustrate the inventive method for memory management, FIGS. 4-7 illustrate the processing of a number of pen strokes a-k that have been recorded at the times $t_a$-$t_k$ on four different physical pages 41-44. Each of these physical pages 41-44 is provided with a unique subset of the global position-coding pattern. Thus, each physical page 41-44 has a corresponding logical page which is identified by a page address $PA_1$-$PA_4$ (PA=Page Address) that can be derived from the global positions coded by the respective subset. For the times $t_a$-$t_k$, it is the case that $t_a<t_b<t_c<t_d<t_e<t_f<t_g<t_h<t_i<t_j<t_k$, i.e. a is the first recorded pen stroke and k is the last recorded pen stroke.

Figure 4:
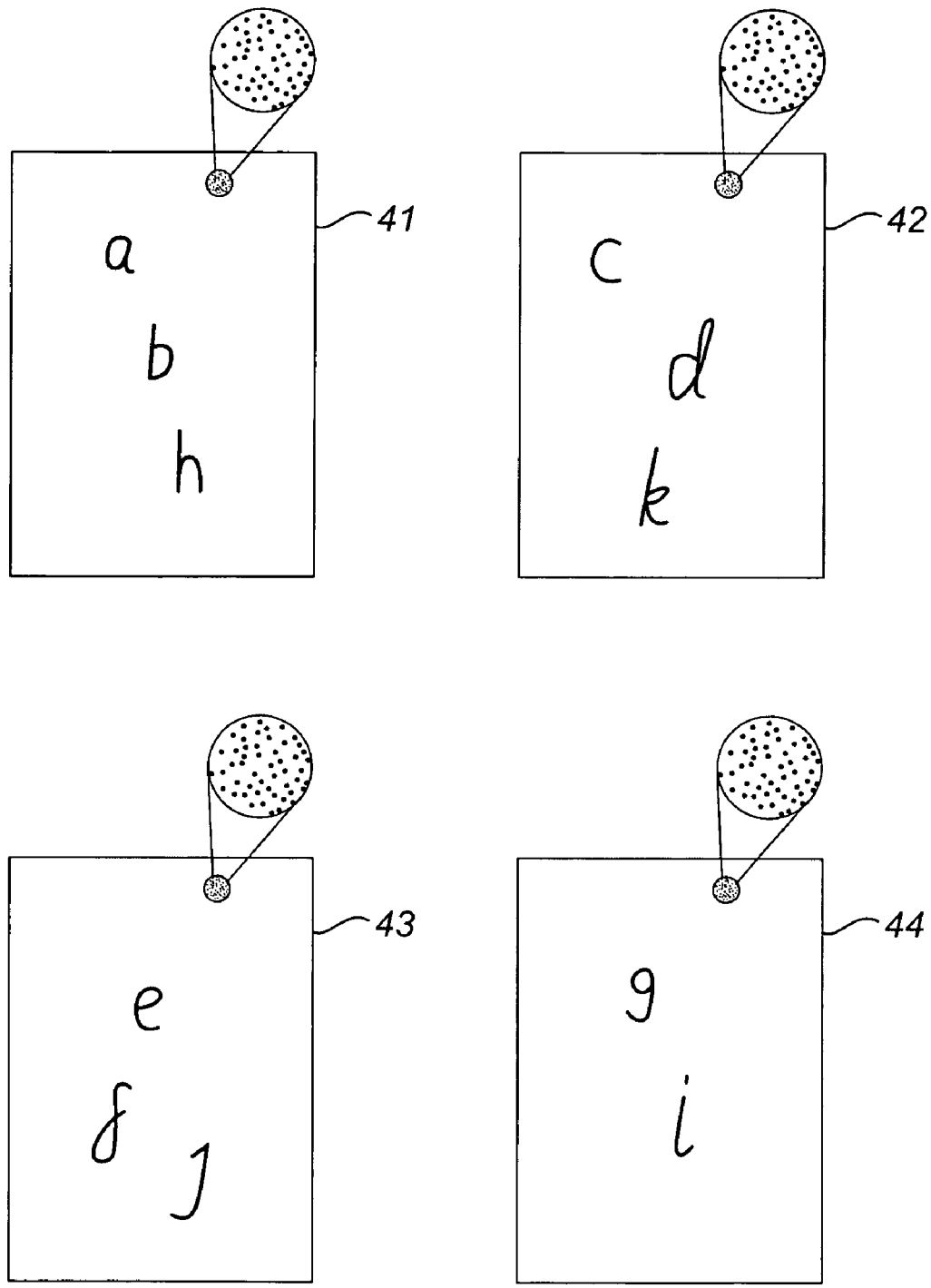
FIG. 4 shows schematically a plurality of physical pages which are provided with subsets of a global position-coding pattern and on which a plurality of pen strokes are made.

In FIG. 4, a, b, and h have been recorded on a first page 41 at the times $t_a$, $t_b$ and $t_h$. On a second page 42, the pen strokes c, d and k have been recorded at the times $t_c$, $t_d$ and $t_k$. On a third page 43, the pen strokes e, f and j have been recorded at the times $t_e$, $t_f$ and $t_j$, and on a fourth page 44, the pen strokes g and i have been recorded at the times $t_g$ and $t_i$, respectively.

Figure 5:
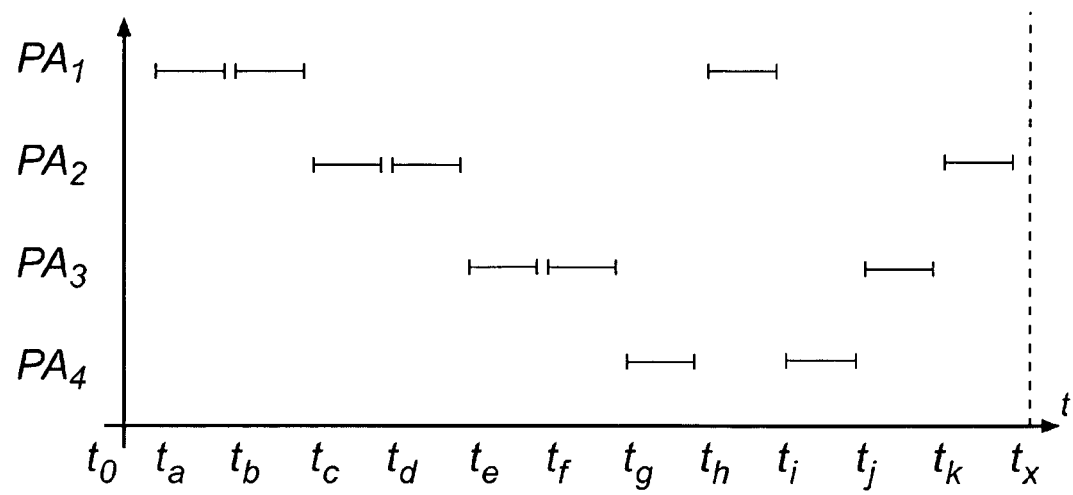
FIG. 5 shows a Gantt-chart-style diagram of the distribution of the pen strokes in FIG. 4 over logical pages and time.

FIG. 5 shows a Gantt-chart-style diagram with page addresses ($PA_1$-$PA_4$) on the y axis and the recording times $t_a$-$t_k$ on the x axis.

Figure 6:
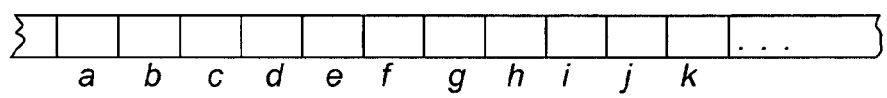
FIG. 6 shows a schematic diagram of the storage of the pen strokes in FIG. 1 in a memory block as shown in FIG. 3.

FIG. 6 shows a schematic diagram of how the pen strokes a-k can be stored in a storage memory in the device. In the diagram in FIG. 6, all the pen strokes are stored in a sequence, but the invention is also applicable to pen strokes that are not stored in a sequence, but are distributed arbitrarily in the device's storage memory.

Figure 7:
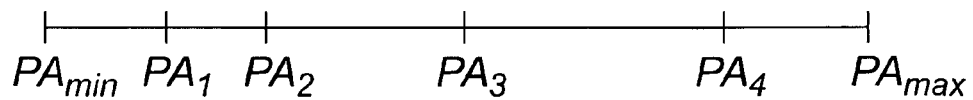
FIG. 7 shows schematically a page address range.

FIG. 7 illustrates the search range from $PA_{min}$ to $PA_{max}$. $PA_{min}$ can be 0 or the smallest page address stored in the device's storage memory, while $PA_{max}$ can be the maximal possible page address according to the position-coding pattern or the largest page address stored in the device's storage memory. The four logical pages' page addresses $PA_1$, $PA_2$, $PA_3$ and $PA_4$ are to be found in the search range.

Figure 8B:
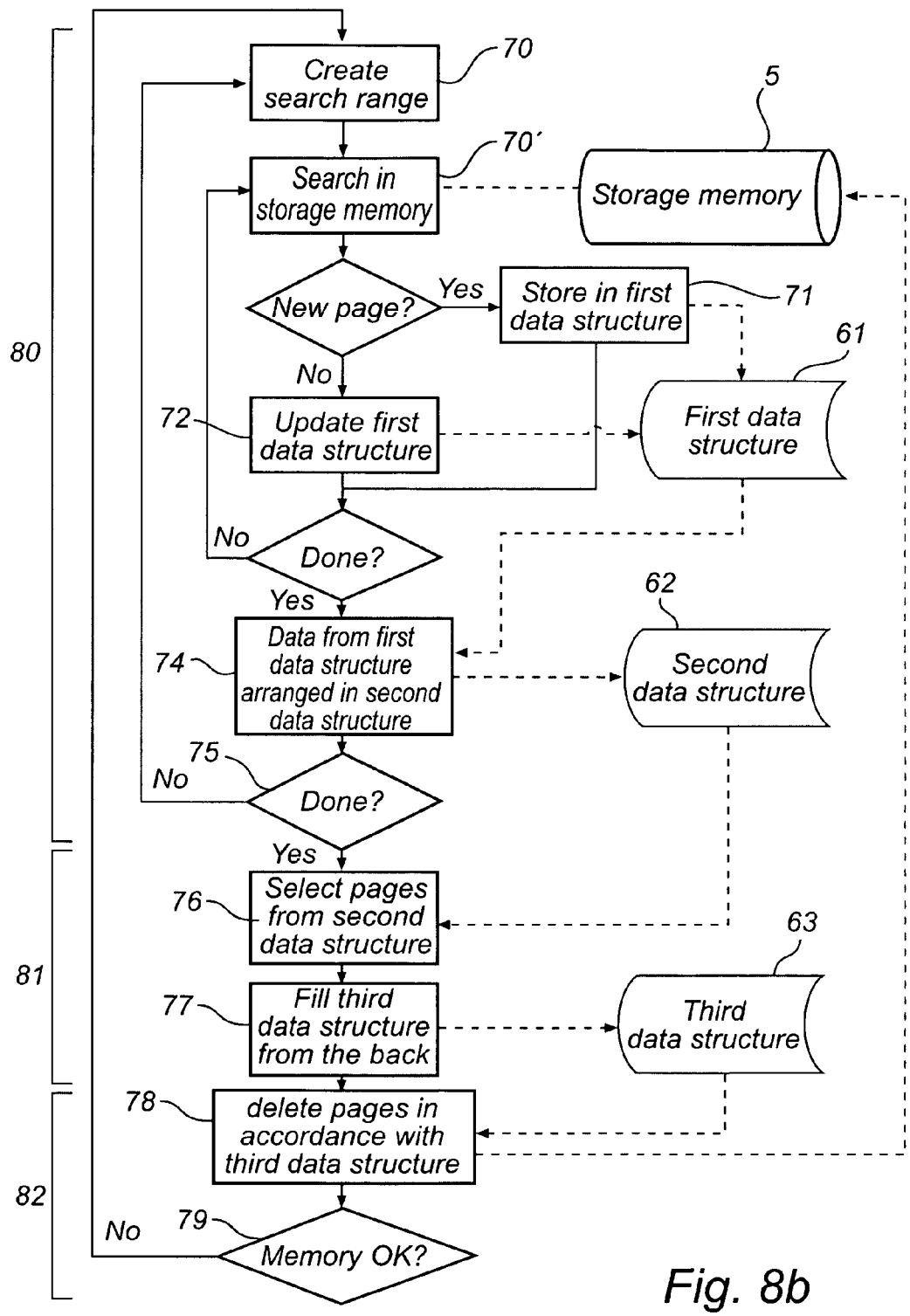

In the following, the method according to an embodiment of the invention will be described with respect to the flow chart of FIG. 8B, which discloses the main steps 80-82 of FIG. 8A in more detail.

In a first step (not shown) a first page address table 61 is initiated. For illustration of principle, A=3 is selected as the table size, i.e., the table will hold three page addresses. In addition, a time table 62 is initiated. The size B of the time table is also set to 3, but it is recognized that other values are also possible for the tables. A practical value for both A and B may be 100, although A and B do not need to be the same size. A first search range is created in step 70 and is set to $PA_{min}$-$PA_{max}$. Thereafter in step 70', a search is carried out in the storage memory 5 for page addresses belonging to the first search range. When a page within the first search range is encountered for the first time in the storage memory 5, it is stored in step 71 as an entry in the page address table 61. If the page address has been encountered at an earlier time and is thus included in an existing entry that is stored in the page address table 61, the recording time of the entry may be updated in the page address table in step 72 instead, so that the page address table 61 contains the most recent recording time for the respective page address. If the size of the page address table is limited and the page address table is full, the largest page address in the table can be replaced by an encountered page address if the encountered page address is smaller than the largest page address in the table, so that the page address table will contain the A smallest page addresses.

After a first search, the page address table can appear as shown in Table 1.

TABLE 1

Page address table after first search.

| Page address | Recording time |
|---|---|
| $PA_3$ | $t_j$ |
| $PA_2$ | $t_k$ |
| $PA_1$ | $t_h$ |

In step 74, the time table 62 is filled with values from the page address table, so that the time table 62 will contain entries that were copied from the page address table, and that are sorted with regard to the time of recording. The resulting time table in this example is shown in Table 2.

TABLE 2

Time table after first search.

| Recording time | Page address |
|---|---|
| $t_k$ | $PA_2$ |
| $t_j$ | $PA_3$ |
| $t_h$ | $PA_1$ |

As A=3, the size of the first search range is $PA_{min}$-$PA_3$. Thereafter, in step 75, a check is carried out whether all the page addresses have been searched. If such is not the case, in step 70 a second search range is created as $I_2$=($PA_3$+1)-$PA_{max}$.

Thereafter a second search is carried out, whereby a second page address table is initiated. As an alternative, the first page address table can be cleared and thereby form the second page address table.

After the second search, the second page address table will appear as shown in Table 3.

TABLE 3

Page address table after second search.

| Page address | Recording time |
|---|---|
| $PA_4$ | $t_i$ |

Now all the page addresses have been encountered and accordingly no new search range needs to be created. If, however, there had been additional page addresses in the memory, entries from the page address table would have been transferred to the time table, after which the page address table would have been cleared, a new search range created and a new search carried out.

Since the time table is not cleared, the most recent recording time $t_i$ for the fourth page $PA_4$ is compared with the most recent recording time in the time table, $t_k$, it being determined that $t_i$<$t_k$ and hence that $t_i$ is to replace $t_k$, so that the time table appears as shown in Table 4.

TABLE 4

Instantaneous image of the time table after $t_i$ has replaced $t_k$.

| Recording time | Page address |
|---|---|
| $t_i$ | $PA_4$ |
| $t_j$ | $PA_3$ |
| $t_h$ | $PA_1$ |

The time table is thereafter sorted, resulting in Table 5.

TABLE 5

The time table after $t_i$ has replaced $t_k$ and the table has been sorted.

| Recording time | Page address |
|---|---|
| $t_j$ | $PA_3$ |
| $t_i$ | $PA_4$ |
| $t_h$ | $PA_1$ |

Table 5 now indicates the three logical pages that have the oldest most recent recording times, but as the time table in the example is a max-heap, the times are in the wrong order. This can be remedied by the initiation of a third data structure 63, below called a result table. This table has a size C, that has been set to 3. In step 77, the result table is filled successively from the bottom by the maximum value from the time table being extracted repeatedly in step 76, resulting in Table 6

TABLE 6

Result table.

| Recording time | Page address |
| --- | --- |
| $t_h$ | $PA_1$ |
| $t_i$ | $PA_4$ |
| $t_j$ | $PA_3$ |

Table 6 now specifies correctly in which order the logical pages are to be deleted from the device's storage memory 5 in step 78. In association with (that is before or after) the deletion in step 78, a check may be carried out in step 79 that the memory freed by the procedure is sufficient according to the criteria that have been determined for how much memory is to be freed. If insufficient memory has been freed, the memory management procedure may be brought back to step 70.

Whenever instance flags or numbers are used to further separate different versions or instances of one and the same page address, the above procedure is modified to treat the combination of page address and instance flag as an "effective page address" in the above-described data structures. Thus, each instance may be independently deleted from the storage memory, based on the latest recording time associated with the specific instance.

Suitable data structures for implementing the invention should be of such a type that they have at least the functions "insert", "find" and "remove/extract". Examples of data structures that can be used are symbol tables such as sorted lists, search trees (binary trees, B-trees, splay trees), stacks or hash tables. Priority queues such as heap-ordered trees or binary heaps can also be used. A plurality of such data structures is described in aforesaid Chapters 6 and 7 of Kingston, J. H.: "Algorithms & Data Structures: Design, Correctness, Analysis", Addison-Wesley Publishing Co., 1995.

If an ordinary completely sorted table is used instead, this can simply be rearranged so that the required sequence is obtained. It can also be advantageous to couple one or more symbol tables in cascading fashion.

As another alternative to the above-mentioned data structures, it is possible to use an unsorted vector, in which linear searching is carried out.

Figure 9:
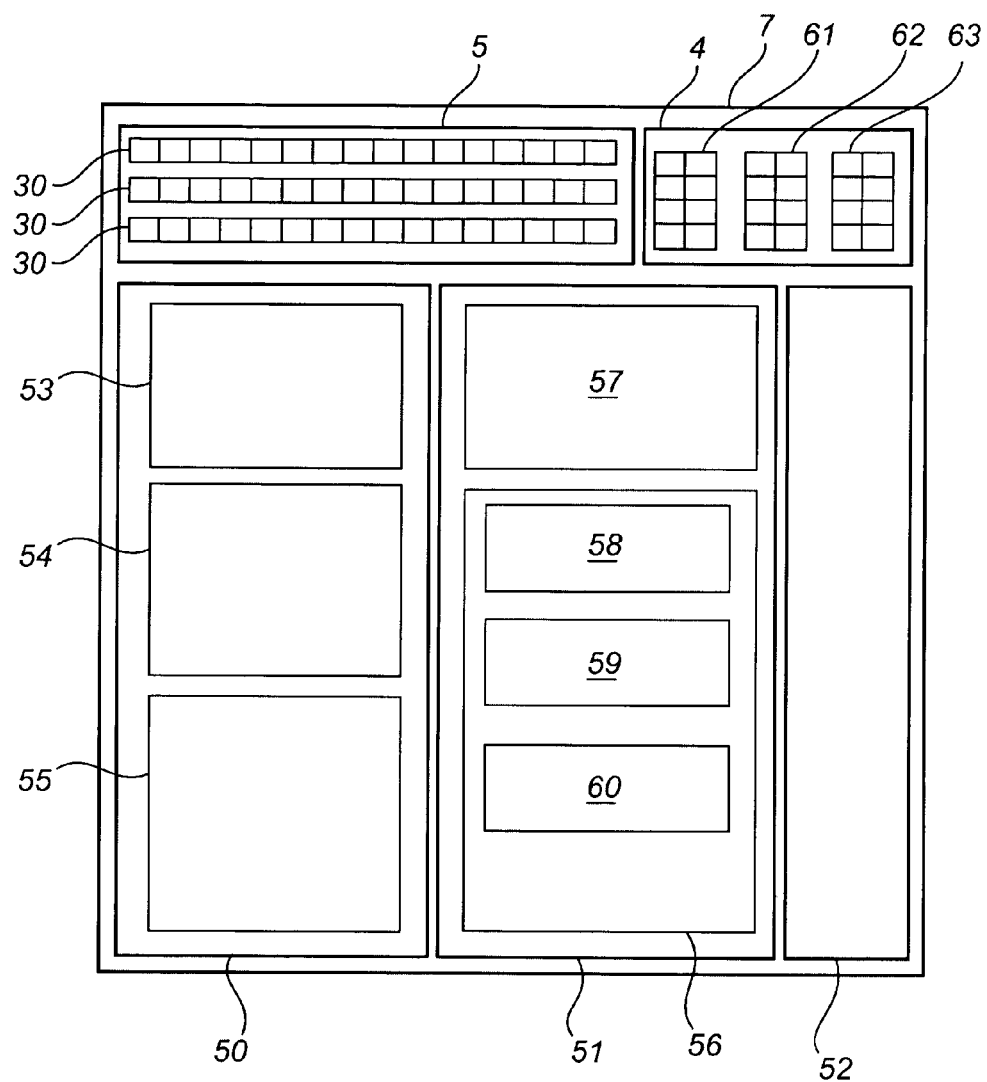
FIG. 9 shows schematically the data processing unit in the device of FIG. 1.

FIG. 9 shows schematically a data processing unit 7 which may implement the method described above. The data processing unit can contain a general programmable processor or signal processor, equipped with suitable software for the implementation of the method, or a circuit specially adapted for the purpose, such as an ASIC (Application-Specific Integrated Circuit) or an FPGA (Field-Programmable Gate Array), or the like. In addition, the data processing unit can have a storage memory 5, in which, for example, pen strokes 30 can be stored, and a working memory (RAM) 4 in which among other things data structures 61-63 can be initiated.

In addition, the device can have means 50 for identifying a plurality of page addresses stored in the memory and for identifying the time of the most recently recorded pen stroke associated with the respective page address, means 51 for selecting one page address from among the identified page addresses, which page address has a most recently recorded pen stroke that was recorded furthest back in time, and means 52 for deleting all strokes associated with the selected page address from the memory 5.

In addition, the means 50 for identifying a plurality of page addresses can comprise means 53 for searching in the memory for a plurality of page addresses associated with pen strokes, means 54 for storing in a first data structure a page address and associated time encountered in the memory, and means 55 for updating the time when a page address stored in the first data structure 61 is encountered in the memory, so that the most recent time for the page address is stored in the first data structure 61.

The means 51 for selecting a page can additionally comprise means 57 for initiating a second data structure 62, which is intended to receive and arrange page addresses and times from the first data structure 61 on the basis of the time at which the most recently recorded pen stroke was recorded for the respective page address, and means 56 for identifying in the second data structure 62 the page address that has the time that lies furthest back in time.

The second data structure 62 can contain a predetermined number of entries, which are sorted in such a way that at least an extreme value, i.e. a largest (maximum) or a smallest (minimum) value, is obtained, which corresponds to the page address that is associated with the most recently recorded pen stroke.

The means 56 for identifying can comprise means 58 for the initiation of a third data structure 63 which can contain, but does not need to contain, the same number of page addresses as the second data structure 62, means 59 for extracting the extreme value from the second data structure 62, and means 60 for extracting and discarding B-C maximum values from the second data structure 62 and for repeated extracting and filling of the third data structure 63 from the bottom or from the back with the C remaining extreme values from the second data structure 62. The method described may, i.e., be used in a situation where the device's storage memory 5 is limited and where there is no upper limit to how many pages there can be in the device's storage memory. The method may, for example, be carried out whenever the device's storage memory 5 attain a preset level of fullness.

The method can be implemented to operate in parallel to the storage of newly recorded coordinates, if the device is provided with sufficient working memory or storage memory to be able to hold data structures of the size that would be required in order to be able to scan a very large number of page addresses. In such an implementation, page address tables and time tables can be kept updated in real time as new pen strokes are recorded and pages can be deleted from the storage memory as this is filled up.

As an alternative, it is possible, when carrying out the method in real time, to limit the number of page addresses that are allowed in the device's storage memory in order thereby to keep down the sizes of the page address table and the time table.

Figure 3:
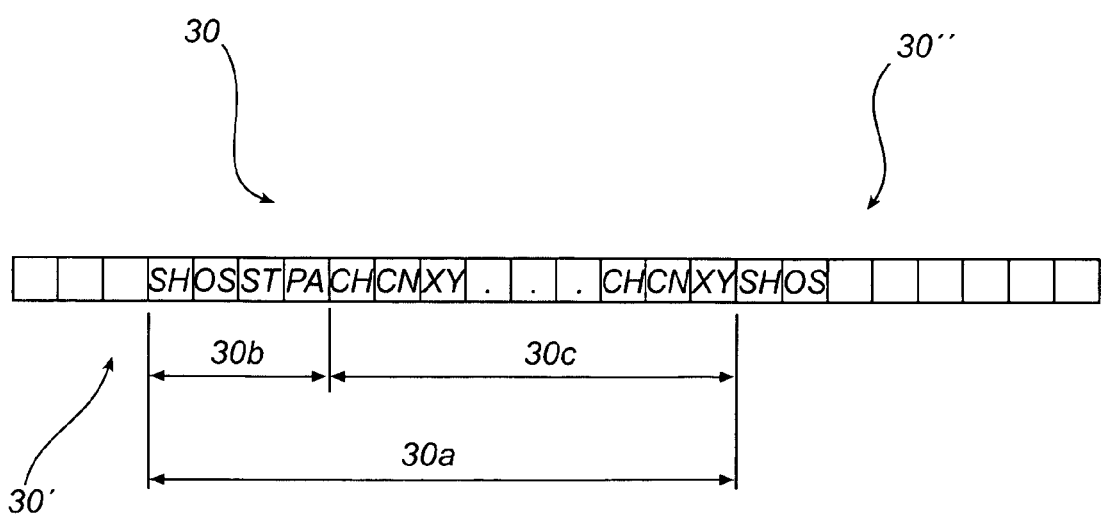
FIG. 3 shows a schematic diagram of a storage memory block, which can be incorporated in the user device of FIG. 1.

FIG. 3 illustrates that pen strokes may be stored as sequences of data bits in the storage memory 5 of a user device 1, in particular in a storage memory of the flash memory type. FIG. 3 shows the storage memory 5 as a series of storage locations (boxes in FIG. 3). The storage locations can be of variable length, so as to comprise different numbers of data bits. In the example of FIG. 3, the pen strokes are stored sequentially, i.e. a current pen stroke 30 is stored after a preceding pen stroke 30' and before a subsequent pen stroke 30".

The stored pen stroke 30, 30', 30" can be of variable length 30*a*, and it consists of two parts: a part of fixed length 30*b* with data that applies to the whole pen stroke, and a part of variable length 30*c* that among other things contains the pairs of coordinates XY that are included in the pen stroke.

The second part can also contain additional information related to the respective pair of coordinates, as described below.

The first part 30b can have a "stroke header" SH that tells that a new pen stroke is following in the storage memory and an "offset" OS that tells the number of bits that are to be found between the start of this pen stroke and the start of the next pen stroke 30". In addition, the first part can have a time ST that tells when the pen stroke was recorded, for example the start time or finish time for the recording of the pen stroke. In addition, the first part 30b can comprise a page address PA that tells on which logical page the pen stroke 30 was recorded or started to be recorded. Each electronically stored pen stroke is thus associated with a logical page via the page address PA. The page address PA can have a plurality of fields, which for example represent the relationship of the logical page to the imaginary surface, such as type, instance flag (if present), etc. The total number of page addresses can be seen as a continuum of page addresses and thereby likened to numbers on a number scale. Thus, on the basis of the relationships between the page addresses, it can be said that a first page address is larger than a second page address if the first page address lies to the right of the second page address on the number scale.

The second part 30c of the pen stroke 30 contains the whole series of pairs of coordinates that are included in the pen stroke. The series of pairs of coordinates is stored in the time order in which the pairs of coordinates were recorded. Thus, with knowledge of the user device's sampling rate and the start time of the pen stroke, it is possible to determine when each pair of coordinates was recorded. According to one embodiment, a "coordinate header" CH can be stored for each recorded pair of coordinates, which coordinate header can describe a format in which associated pairs of coordinates are stored, that is whether the coordinates are compressed, whether they comprise coordinate numbers CN for each pair of coordinates, and whether they comprise force components or angle indications for the orientation of the user device during the recording.

A pen stroke 30 can also comprise an "End of Stroke (EOS) that indicates the end of the pen stroke. This EOS can be provided with an indication that the pen stroke goes over several logical pages, i.e. that the pen stroke creates an association between the logical pages. In addition, the associated page address can be indicated in EOS. It is also possible to arrange an indication in SH that the pen stroke is included in an association and which page address is included in the association.

When a pen stroke starts to become recorded, i.e. when the user device is lowered onto a base, a stroke header SH is first written to the storage memory. SH can initially be set to a value that indicates that the pen stroke is incorrect. When the user device is then raised from the base and the pen stroke is completed, the stroke header SH can be rewritten to a value that indicates that the pen stroke is normal. In addition, the offset OS can be updated to indicate the correct length of the pen stroke. In this way, interrupted pen strokes can be recorded in the storage memory as incorrect if an interruption should occur during the recording of a pen stroke. These incorrect pen strokes can, for example, be recovered where possible or can simply be deleted.

Generally, when a pen stroke 30 is to be deleted from the storage memory, this can be carried out by the stroke header SH being changed to a value that indicates that the space is deleted. In this way, the storage memory space in which the pen stroke was stored becomes available again for writing of new information.

As an alternative to the storage arrangement discussed above, the storage memory may be arranged as a file system, with one file being initiated for every page address. Every such file may store the pen strokes sequentially, such that new pen strokes are appended to the associated file as they are recorded. Similar to FIG. 3, the pen strokes may be stored with a header part (corresponding to 30b in FIG. 3) and a coordinate part (corresponding to 30c in FIG. 3), although the content of these parts may differ from FIG. 3. In the event of instance flags being used, these may be included to indicate different logical pages in the file for the original page address. Alternatively, a new file may be initiated for every logical page created as a result of the above-mentioned initialization indication.

Freeing of storage space 5 can be initiated when a certain amount of the storage memory 5 is full. When freeing of the storage space has been initiated, this can continue until a certain amount of the storage memory is free. As an example, freeing of the storage memory can be initiated when 3% of the storage memory space is free and can be terminated when 10% of the storage memory space has become free. After freeing the storage memory, it may be expedient to defragment the storage memory in a way that is known to those skilled in the art.

It is further expedient, when freeing storage memory, to lock any page addresses of pen strokes that are being processed in the working memory, so that the previously recorded content on the corresponding logical pages does not disappear during a freeing of storage memory while the user is in the process of entering new pen strokes.

It should also be noted that information may be transferred between the device's storage memory and working memory, so that data, such as pen strokes, data structures and the like, is available for processing from the memory that is the most expedient for the purpose. Thus the working memory and the storage memory can be interchangeable in respect of where the method is carried out and where the data is stored.

Alternative Ways of Freeing Storage Memory

An alternative way of selecting which pages are to be deleted is to let the user determine this. A first example of how this can be carried out is that each physical page is provided with a position-coded "delete" field, all the pen strokes on the corresponding logical page(s) being deleted from the device's storage memory when the device records one or more pair of coordinates from this field.

A second example is that by means of a suitable method, for example according to the method as described above, the device selects a number of pages that can be deleted and suggests these to the user via a suitable interface (for example a display on the device, or on an associated PDA, mobile telephone, computer, etc), with the user being given the opportunity to confirm which pages are to be deleted from the storage memory.

A third example is that the user writes or enters in some other way a "delete" command and in association with this indicates in a suitable way a logical page that is to be deleted, for example by recording a pair of coordinates from the corresponding physical page.

Another way of selecting pages that can be deleted from the storage memory is to specify a date or a time period which defines when the respective logical page is to be deleted. This can be carried out, for example, by a "delete"

table being created in the device, where logical pages with an "expiry date" are listed. This can be particularly advantageous for recording pen strokes originating from, for example, physical pages that are associated with time-limited offers such as advertisements, etc. If required, this can also be combined with a suitable alerting mechanism.

An alternative to this is to delete all logical pages that have a pen stroke (for example the oldest or youngest) with a life span that exceeds a preset existence time limit.

Another alternative is that as soon as all the pen strokes associated with a logical page have been sent to an external unit, such as a computer, a PDA, a server, etc, the pages are deleted from the device's storage memory.

It is also possible, within the scope of the present invention, to combine the methods described above.

For example, logical pages can be classified in such a way that they are given different attributes prior to deletion or sorting. Thus, logical pages of certain types can be deleted straight away without any involvement by the user, while logical pages of other types require the user to confirm that they can be removed. Some types of logical pages can be specified so that they are removed automatically after a certain date or time period and others can be removed once they have been sent to an external unit.

It also should be noted that the memory management method as set forth herein is also applicable to other user devices, such as those mentioned by way of introduction. For example, the user device may be a pen-like device arranged to record its motion based on triangulation of signals (ultrasound, infrared radiation, etc), based on signals from internal acceleration sensors, based on signals from a mechanical motion sensor (trackball etc), based on signals from stress sensors connected to the pen point, by combining electronic images of the ink trace on the base, by comparing signals representing coherent radiation emitted towards the base and reflected therefrom, respectively, etc. Such a user device should also be arranged to distinguish between different logical pages, for example based on a manual indication (by the user pressing a button on the device, writing command with the device, etc), or based on an explicit page address input (bar code detection, keypad entry, etc). Alternatively, the user device may be an electronic clipboard or digitizer which is arranged to record the motion of a pen or stylus on one of several physical pages. According to yet another alternative, the user device may be the pen that operates on such a clipboard.

We claim:

1. A method for freeing memory in a device with limited memory, in which a plurality of pen strokes have been recorded, in electronic form in the memory in association with a page address of one of a plurality of logical pages and a recording time, the method comprising:
   identifying page addresses for the plurality of pen strokes recorded in the device;
   identifying the recording time of the most recently recorded pen stroke associated with each of the identified page addresses;
   selecting the page address among the identified page addresses which has the oldest most recently recorded pen stroke; and
   deleting all the pen strokes associated with the selected page address.

2. The method as claimed in claim 1, wherein the step of identifying page addresses for the pen strokes stored in the memory comprises:
   searching in the memory for a plurality of page addresses associated with the plurality of pen strokes;
   determining if a page address encountered during the search is stored in a first data structure;
   if the encountered page address is not stored in the first data structure, then storing the encountered page address and the recording time associated there-with in the first data structure; and
   if the encountered page address is already stored in the first data structure, updating the recording time therein associated with the page address so that the latest recording time of the page address is stored in the first data structure.

3. The method as claimed in claim 2, wherein the step of searching in the memory is restricted to predetermined page addresses belonging to a first search range.

4. The method as claimed in claim 3, wherein the step of identifying page addresses for the pen strokes stored in the memory is repeated for a plurality of further search ranges, which together comprise page addresses for a major portion of the pen strokes stored in the memory.

5. The method as claimed in claim 4, wherein the step of identifying page addresses for the pen strokes stored in the memory comprises:
   for each search range, going through the first data structure and arranging page addresses and recording times form the first data structure in a second data structure according to predetermined rules.

6. The method as claimed in clam 5, wherein the predetermined rules include, if the second data structure is full and an encountered page address in the first data structure has a recording time that is older than a youngest recording time in the second data structure, the page address associated with said youngest recording time in the second data structure is replaced by said encountered page address, so that the second data structure comprises the page addresses with which the oldest most recently recorded pen strokes are associated.

7. The method as claimed in claim 6, wherein the second data structure contains a predetermined number of page addresses and is arranged for extraction of an extreme value, which corresponds to the page address that has the most recently recorded pen stroke.

8. The method as claimed in claim 6, wherein the step of selecting the page address among the identified page addresses comprises selecting from the second data structure the page address that has the oldest recording time.

9. The method as claimed in claim 8, further comprising the step of arranging a plurality of page addresses and recording times from the second data structure in a third data structure, so that this contains the page addresses with which the oldest recording times are associated.

10. The method as claimed in claim 9, wherein the page addresses arranged in the third data structure are sorted with regard to the their associated recording time.

11. The method as claimed in claim 5, wherein one of the first and the second data structures is one of a symbol table, a sorted list, a search tree, a hash table, a priority queue, a stack, a heap-ordered tree and a binary heap.

12. The method as claimed in claim 5, wherein the second data structure produces a sorted list of a plurality of page addresses with which the oldest most recently recorded pen strokes are associated.

13. The method as claimed in claim 1, wherein the step of identifying page addresses is effected for a sequence of ranges of page addresses, and comprises, for each range in said sequence, arranging the identified page addresses and the associated recording times as records in a first data structure and transferring records from said first data structure to a second data structure such that the second data structure contains the thus-far identified page addresses with the oldest recording times.

14. The method as claimed in claim 1, wherein the specific logical page is determined by a pen stroke associated with the specific logical page having been recorded prior to a predetermined time.

15. The method as claimed in claim 1, wherein the specific logical page is determined by a logical page suggested by the device being confirmed by the user.

16. The method as claimed in claim 1, wherein a pen stroke is deleted by a state indicator for the memory space that is to be deleted being changed to indicate that the memory space is available.

17. A computer readable medium encoded with computer executable instructions for freeing memory in a device with limited memory, in which a plurality of pen strokes have been recorded in electronic form in the memory in association with a page address of one of a plurality of logical pages and a recording time, the instructions causing a computer system to execute the steps of:
 identifying page addresses for the plurality of pen strokes recorded in the device;
 identifying the recording time of the most recently recorded pen stroke associated with each of the identified page addresses;
 selecting the page address among the identified page addresses which has the oldest most recently recorded pen stroke; and
 deleting all the pen strokes associated with selected page address.

18. A device for electronic recording of pen strokes, each of which is associated with a page address of a logical page and a recording time, the device comprising:
 a data processing unit including a memory with limited space for storing the pen strokes in electronic form, the data processing unit being configured to
 identify page addresses for the pen strokes recorded in the device;
 identify the recording time of the most recently recorded pen stroke associated with each of the identified page addresses;
 select the page address among the identified page addresses which has the oldest most recently recorded pen stroke; and
 delete all the pen strokes associated with the selected page address.

19. The as claimed in claim 18, which has means for carrying out a method for freeing memory in a device with limited memory, into which device a plurality of pen strokes is entered, each of which pen strokes is stored in electronic form in the memory in association with on of a plurality of logical pages and a recording time, wherein all the pen strokes associated with a specific logical page are deleted when space in the memory is to be freed, and wherein the specific logical page is determined on the basis of a time at which a pen stroke associated with the logical page was recorded by the device.

* * * * *